(12) United States Patent
Rödiger et al.

(10) Patent No.: US 6,248,434 B1
(45) Date of Patent: Jun. 19, 2001

(54) COMPOSITE BODY COMPRISING A HARD METAL, CERMET OR CERAMIC SUBSTRATE BODY AND METHOD OF PRODUCING SAME

(75) Inventors: Klaus Rödiger, Bochum; Hartmut Westphal, Dermbach; Klaus Dreyer, Essen; Thorsten Gerdes; Monika Willert-Porada, both of Dortmund, all of (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/319,443
(22) PCT Filed: Nov. 26, 1997
(86) PCT No.: PCT/DE97/02774
§ 371 Date: Jun. 3, 1999
§ 102(e) Date: Jun. 3, 1999
(87) PCT Pub. No.: WO98/28462
PCT Pub. Date: Jul. 2, 1998

(30) Foreign Application Priority Data

Dec. 24, 1996 (DE) .............................. 196 54 371
May 30, 1997 (DE) .............................. 197 22 728

(51) Int. Cl.[7] .............................. C23C 16/02; B22F 3/10; C04B 35/00
(52) U.S. Cl. .............................. 428/307.7; 264/603; 264/610; 264/667; 264/669; 264/674; 427/532; 427/553; 427/561; 427/585; 427/598; 427/249; 427/255; 427/255.2; 427/255.3; 427/307; 427/309; 427/314; 427/331; 427/337; 427/419.1; 427/419.3; 427/419.7; 427/419.8; 428/304.4; 428/306.6; 428/307.3; 428/310.5; 428/312.12; 428/312.8; 428/319.1; 428/408; 428/457; 428/698; 428/704
(58) Field of Search .............................. 264/603, 610, 264/667, 669, 674; 427/532, 553, 561, 585, 598, 249, 255.1, 2.3, 307, 309, 314, 331, 337, 419.1, 419.2, 419.3, 419.7, 419.8; 428/304.4, 306.6, 307.3, 307.7, 310.5, 312.2, 312.8, 318.4, 319.1, 408, 457, 698, 704

(56) References Cited

U.S. PATENT DOCUMENTS

| | | |
|---|---|---|
| 4,374,685 | 2/1983 | Suzuki et al. . |
| 4,548,786 | 10/1985 | Yohe . |
| 4,649,084 * | 3/1987 | Hale et al. .............................. 428/698 |
| 4,719,078 * | 1/1988 | Miyashita et al. .............................. 419/53 |
| 4,938,673 * | 7/1990 | Adrian .............................. 419/23 |
| 5,068,148 | 11/1991 | Nakahara et al. . |
| 5,154,779 | 10/1992 | Holcombe et al. . |
| 5,238,710 | 8/1993 | Ahmad et al. . |
| 5,348,774 * | 9/1994 | Golecki et al. .............................. 427/543 |

FOREIGN PATENT DOCUMENTS

| | | |
|---|---|---|
| 34 22 174 A1 | 12/1985 | (DE) . |
| 0 279 898 | 8/1988 | (EP) . |
| 0 549 801 A1 | 7/1993 | (EP) . |
| WO 96/33830 | 10/1996 | (WO) . |

* cited by examiner

Primary Examiner—Archene Turner
(74) Attorney, Agent, or Firm—Herbert Dubno

(57) ABSTRACT

The invention concerns a composite body consisting of a hard metal, cermet or ceramic substrate body and at least one layer of a mechanically resistant material, a ceramic substance, a diamond-like layer, amorphous carbon and/or hexagonal boron nitride. The invention also concerns a method of producing this composite body, wherein, when the green compact has been dewaxed, with its pores still open and whilst it continues to be heated as from a temperature of between 600° C. and 1100° C., it is acted upon by sublimable solids and/or reaction gases which are necessary for coating purposes. The temperature of the green compact is then further increased and the latter is fully compressed by sintering, before one or more layers of the above-mentioned type is/are applied.

19 Claims, No Drawings

COMPOSITE BODY COMPRISING A HARD METAL, CERMET OR CERAMIC SUBSTRATE BODY AND METHOD OF PRODUCING SAME

The invention relates to a method for the production of a coated cermet, hard metal or ceramic substrate body, whereby from an initial powder mixture a green compact is precompressed, dewaxed and subsequently sintered in a microwave field and coated with a coating of hard materials, respectively with a coating for protection against corrosion and wear, consisting of one or several layers.

Further the invention relates to a composite body consisting of a substrate body of the mentioned kind and at least one layer of a hard material.

Composite bodies of the mentioned kind are used especially as cutting plates in machining operations, or as material capable to resist high temperatures. According to the state of the art, as a rule the respective composite bodies are produced through sintering of pressed bodies, which consist of the corresponding mixtures of hard materials and metal powders (binders). The sintering takes place in ovens, which for instance are equipped with graphite heating elements, whereby the heating of the samples is done indirectly by means of the radiation emitted by the heating elements, as well as through convection, respectively heat conductivity. The drawback of this process technology consists in that the selection of the oven atmosphere is considerably limited by the chemical properties of the heating elements. Furthermore the heating of hard metals, cermets or ceramics takes place from the outside in, and is substantially controlled by the heat conductivity and the emission capability of the samples. Depending on the heat conductivity and the emission capability of the samples, the variation range of the heating and cooling rates are strongly limited, which is the reason why expensive steps, such as a high expenses for the apparatus and the process technology, have to be taken in order to satisfactorily sinter ultra-fine hard metals.

In order to eliminate this drawback, the WO 96/33830 proposes to sinter precompressed green compacts of cermet or a hard metal in a microwave field. The precompressed green compact can thereby be irradiated with microwaves in a continuous or pulsed manner, already during heating, whereby during heating plastifiers such as wax, are eliminated.

Optionally the finished sintered body can also be subsequently coated with one or several layers of hard material by means of PVD, CVD and/or a plasma-enhanced CVD process.

Suitable microwave sintering ovens and sintering processes by means of microwave radiation are described for instance in DE 195 15 342.

Besides the selection of the materials for the substrate coating, which include carbides, nitrides and/or carbonitrides of elements of the Groups IV to VI, diamond-like materials, ceramics such as $Al_2O_3$ and/or $ZrO_2$, as well as boron nitride, the adhesion of the coating to the sintered body as a substrate body is of decisive importance.

It is the object of the present invention to indicate a method, as well as a coated substrate body of the kind mentioned in the introduction, wherein the adhesion of the sole or first layer to the substrate body can be controlledly improved. The method has to be able to be carried out without great technical effort, to be easily handled and to conserve energy.

This object is achieved due to the process defined in claim 1, which according to the invention is characterized in that after the dewaxing of the green compact, while the pores are still open, at temperatures between 600° C. and 1100° C., preferably between 800° C. and 1100° C., the green compact is treated with the reaction gases necessary for the coating with hard materials and/or sublimable solid substances, then the temperature of the green compact is further increased and the latter is completely densified through sintering, after which finally one or more layers of hard material, ceramic, diamond-like layers, boron nitride or the like are applied. The basic concept of the invention consists in that when the outer pores are not yet completely closed, the surface of the substrate body is still relatively rough. If the CVI (chemical vapor infiltration), CVD or the PCVD coating is started in this phase, the coating material can partially fill out the existing open pores, so that during the finishing sinter process an intimate bond between the coating material and the substrate body results, which in addition allows for a gradient transition from the material of the substrate body to the material of the coating. The desired first or sole layer does not have to be applied up to the desired thickness during the heating phase, it is enough to superficially wet the surface of the substrate body with a thin layer of the respective coating material. The difference between the conventional sintering in an oven heated by heating elements, wherein the sintered bodies are heated from the outside in, and the invention is that the microwave radiation penetrates the substrate body already at low temperatures. Since substrate bodies, respectively a charge thereof placed in a microwave field are hotter than the cavity, the substrate bodies, respectively a charge thereof, are, respectively is hotter inside than on the outside; correspondingly the sintering process takes place form the inside out. The layer or layers applied during the heating phase do not influence or disturb the sintering process, in case the composition of the gas phase is changed. Generally the sintering and coating can also be shortened to the extent that already during the heating phase a first coating was deposited on the substrate body, on which then after the finished sintering optionally further layers can be applied after a previous cooling at the usual CVD, plasma-enhanced CVD temperature "in one heat".

Further developments of the process of the invention are described in the dependent claims.

In the case of hard metals the introduction of the gases required for the reactive deposition of the mentioned materials starts when the volume proportion of the open pores with respect to the total volume of the hard metal substrate body amounts to >10%, preferably 35 to 60%.

The same applies to ceramic or cermets with regard to the open pores, preferably they should amount areawise in ceramics to 35 to 70%, respectively 50 to 60% and in cermets 35 to 60%, preferably 40 to 60%.

Depending on the desired penetration depth of the infiltration, it can be especially advantageous in ceramics to first subject the green compacts to a preliminary densification at high temperatures, before the green compact, after a cooling period between 600° C. and 1100° C., is treated with the reaction gases and/or sublimable solid substances required for the hard material coating. As an alternative, particularly in the case of hard metals and cermets, the mentioned treatment can take place during the heating of the green compact after dewaxing (binder removal).

Preferably already at the beginning of the treatment with reaction gases and/or sublimable solid materials with the use of carrier gas (argon, etc), the temperature is kept constant over a period of time up to an hour, or the heating speed is slowed down to maximum 200° C./h until it reaches at least 1000 to 1100° C. This procedure insures that there is sufficient time in a temperature interval suitable for CVI, respectively for CVD deposition for the deposition of a first thin layer. As already mentioned, the further layers of hard material, ceramic, diamond, boron nitride or similar substances are applied directly by CVD or PCVD in the cooling phase.

For the final CVD/PCVD coating an essential advantage of microwave sintering comes to bear, namely the possibility to keep a part of the open porosity up to high densities. This insures a good anchoring of the layers applied by CVD-PCVD during the cooling phase, at a porosity of <10%. The preliminary treatment of the surfaces, as required by conventional CVD/PCVD is here eliminated.

Furthermore due to a controlled setting of the (partial) pressure and selection of the temperature, the process of the invention makes it possible to fill the marginal pores of the substrate body with the materials (coating material) formed by the reaction gases and/or sublimable solid materials, whereby in the substrate body, from the outside in up to a maximal penetration depth of 200 μm, an inwardly decreasing gradient of these materials results. Different from the complete infiltration of ceramic materials due to the compounds originating from or formed during the gas phase, basically known to the state of the art, which are spread substantially homogeneously over the infiltrated body, with the process of the invention only the marginal pores, which are not yet close during the heating phase are filled in decreasing measure inwards by the materials formed during the gas phase, before the substrate body undergoes its final densification during sintering.

Depending on the size of the charge, the preferably used microwave power ranges between 10 W to 100 kW. The pressure set during the mentioned heating phase, which is formed by the gases, carrier gases and other process accessories involved in the deposition reaction, ranges during deposition in the heating phase between 0.1 kPa and 100 kPa. The penetration depth of the coating materials in the marginal pores of the substrate body can vary depending on the pressure. All gases known within the framework of CVI and CVD depositions can be used as reaction gases, particularly metal halogenides, methane, nitrogen, gases with a cyanide content with a triple bond between carbon and nitrogen, as for instance in acetonitrile alcoholates, β-diketonates and carbonates. Also molecular precursors which deliver elements for the desired reaction deposition or pore filling can also be considered, particularly metallo-organic compounds.

Preferred materials which are deposited on substrate bodies in one or more layers are particularly carbides, nitrides or carbonitrides of metals of the groups IV to VI of the classification of elements, $Al_2O_3$, $ZrO_2$, carbon as a diamond-like layer, amorphous carbon and/or cubic, respectively hexagonal boron nitride.

According to a further development of the invention, it is possible to deposit on a ceramic substrate body of $Al_2O_3$ a ceramic layer with infiltrated $ZrO_2$ and/or one or more further layers, particularly of TiC. Correspondingly it is also possible to deposit directly onto the substrate body, as an intermediate layer or an outer layer, single or multiphase layers formed by hard materials, cermet, ceramics and/or metals.

If during the heating phase a first thin layer of 0.1 μm to 10 μm, preferably of 1 μm, is applied, then according to a preferred embodiment of the invention, after the final sintering of the thinly coated substrate body, due to a corresponding introduction of the same reaction gases as in the heating phase, the "started" coating is continued until the desired thickness of the sole or first layer is reached.

Further the invention relates to the composite body defined in claim 13, which consists of a substrate body of hard metal-cermet or ceramic and at least one layer of a hard material, a ceramic material, a diamond-like material, amorphous carbon and/or boron nitride, and which according to the invention is characterized in that in the zone of the substrate body bordering on the layer, hard materials identical to the ones of the first hard material layer are embedded in the substrate body at an inwardly decreasing gradient, preferably to a penetration depth of maximum 200 μm and/or the border between the substrate body surface and the first layer presents a roughness which corresponds approximately to the surface roughness of partially densified green compact with an open porosity at 600 to 800° C. prior to sintering. With regard to the advantages of this composite body and the special embodiment the same as above applies.

In a concrete embodiment example six indexable inserts were coated and sintered at a normal pressure.

In a first partial step, the paraffined WC-CO green compacts (cobalt content 6% by mass) are dewaxed in the 2.45 Ghz multimode applicator in an Ar atmosphere at a low microwave power of less than 250 W for approximately 20 minutes, whereby the green compacts are arranged in an insulating box of microwave-transparent $Al_2O_3$ fiber plates, for thermal insulating. After being dewaxed, the green compacts are further heated up to 850° C. At this temperature from the gas phase a TiC precursor is deposited on the samples for 20 minutes. At this temperature, the samples have an open porosity of 45% of the theoretical density. As a TiC precursor serves titanium(diidopropoxide)BiS (pentandinate) (TDP). The charging of the atmosphere with TDP is performed with the assistance of an argon flow of 1 l/min, which is directed through a preheated TDP receiver heated up to 100° C.

The gas stream charged with TDP is fed directly into the microwave-transparent insulation box through small ceramic tubes. In this first coating stage, wherein the temperature is kept at 850° C., in the zones close to the margin, the inner surfaces accessible due to the open porosity are only partially coated, while the marginal zone is completely coated. After the dwelling time is completed, the green compact is heated for 30 minutes up to the sintering temperature of 1400° C, by increasing the power of the microwave radiation. The sintering temperature is maintained for 15 minutes, after which the completely densified sintered bodies (indexable inserts) are cooled down to 850° C. and at this temperature are again coated with TiC under the above-described conditions.

In a further embodiment example six indexable inserts of the same composition as described above are coated and sintered in microwave plasma. Differently than in the afore-described process, after the temperature of 850° C. has been reached, the introduction of the Ar-TDP mixture starts in the heating phase, at the same time the pressure is reduced to the extent that inside the insulation box plasma conditions are reached even at the existing power of the microwave field. The pressure is set between 5 kPa and 30 kPa in the adjusted microwave plasma the coating is performed for 20 minutes and subsequently the pressure is again increased to 100 kPa, in order to sinter the indexable inserts in the microwave field as described in the first embodiment. In the cooling phase at 850° C. the pressure is again reduced with the introduction of the Ar-TDP mixture, until the plasma conditions are reached, in order to apply for 20 minutes a closed TiC layer.

In a third embodiment example the same steps as in the first two variants were followed, in addition by changing the gas atmosphere, respectively the precursor, on the first TiC layer one or more further layers are applied, namely as a second layer TiCN or TiN, respectively the layer sequence TiCN and TiN. Alternatively thereto, as a second layer a carbide and/or nitride of Zr, as well as $ZrO_2$, $Al_2O_3$, respectively combinations thereof are deposited.

In a further embodiment $Al_2O_3$ green compacts were subjected to binder removal in a first partial step in a 2.45 Ghz multimode applicator under normal pressure at low MW-power of 300 W for approximately 30 minutes. For thermal insulation reasons the green compacts were arranged in a MW-transparent insulation box made of $Al_2O_3$ fiber plates. After binder removal, the green compacts were heated up to 800° C. At this temperature from the gas phase a $ZrO_2$ precursor is deposited for 30 minutes on the samples. As a precursor serves zirconium tetrapropylate (ZTP).

The charging of the atmosphere with ZTP takes place with the aid of an argon stream of 1 l/min, which is directed onto a ZTP-receiver preheated to approximately 200° C. The gas stream charged with ZTP is fed directly into the MW-transparent insulation box through small ceramic tubes. After the coating is completed, the green compacts are heated for 50 minutes to the sintering temperature of 1600° C. by increasing the MW-power. After a dwelling time of 30 minutes the densified $Al_2O_3$ bodies are cooled.

In the aforedescribed arrangement in a further embodiment example the $Al_2O_3$ green compacts are first subjected to binder removal and heated in 90 minutes up to a sintering temperature of 1400° C. After a dwelling time of 20 minutes, the incompletely densified bodies are cooled to 800° C. and coated in the aforedescribed manner with $ZrO_2$. After this coating which is limited to the area close to the surface, the samples are heated to 1600° C. and after a dwelling time of 30 minutes are again cooled down to room temperature.

What is claimed is:

1. A method of producing coated cermet, hard-metal or ceramic substrate bodies comprising the steps of:
   (a) precompressing a green compact from an initial powder mixture continuing a wax and powders sinterable to form a cermet, hard-metal or ceramic body;
   (b) dewaxing the green compact;
   (c) after dewaxing and with the green compact still having open porosity, treating the green compact with reaction gases or sublimable solid materials capable of forming a coating on the body at a temperature between 600° C. and 100° C., then increasing the temperature of the green compact and completely densifying the green compact by sintering in a microwave field; and
   (d) thereafter applying at least one layer of hard material, ceramic, diamond-like layers, hexagonal boron nitride and/or amorphous carbon to the sintered body.

2. The method defined in claim 1 wherein the temperature of said green compact treated with reaction gases or sublimable solid materials is 800° to 1100° C.

3. The method according to claim 1 wherein the green compact is only treated with reaction gases or sublimable solid materials when the proportion of open pores in relation to the total volume of the substrate body >10%.

4. The method according to claim 1 wherein the green compact is treated in step (c) when the proportion of your pores equals 40 to 60% of the theoretical density in a hard metal or 35 to 70% in a ceramic or 35 to 60% in a cermet.

5. The method defined in claim 1 wherein the green compact is treated in step (c) when the proportion of open pores is 50 to 60% in a ceramic or 40 to 60% in a cermet.

6. The method according to claim 1 wherein with the start of the treatment in step (c) with reaction gases or sublimable solid materials the temperature is kept constant over a period of up to one hour, or the heating speed is slowed down to a maximum of 200° C./h until at least 1000° to 1100° C. are reached.

7. The method according to claim 1 wherein after dewaxing of the green compact, when the porosity is still open during the further heating of the green compact, starting from a temperature ranging between 600° C. and 1100° C., the green compact is treated with the reaction gases and/or sublimable solid materials necessary for the coating, then the temperature of the green compact is further increased and the latter is completely densified through sintering, and subsequently at least one layer of hard materials, ceramic, diamond-like layers, hexagonal boron nitride and/or amorphous carbon is applied.

8. The method according to claim 1 wherein a ceramic green compact is first precompressed at a higher temperature, then cooled down to temperature between 600° C. and 1100° C., and then treated with the reaction gases or sublimable solid materials necessary for coating, before the temperature of the green compact is again raised and the green compact is fully densified by sintering and finally at least one layer of hard materials, ceramic, diamond-like layers, hexagonal boron nitride and/or amorphous carbon is applied.

9. The method according to claim 1 wherein the layer of hard materials, ceramic, diamond, hexagonal boron nitride or amorphous carbon is directly applied during the cooling phase by CVD or PCVD.

10. The method according to claim 1 wherein through a controlled setting of a partial pressure and temperature selection, the pores which are close to the margin of the substrate body are filled by a substance formed from the reaction gases or the sublimable solid materials, whereby in the substrate body from the outside in, up to a maximal penetration depth of 200 μm, an inwards decreasing gradient of this substance results.

11. The method according to claim 1 wherein a microwave power between 10 W and 100 kW is set for the microwave sintering.

12. The method according to claim 1 wherein the pressure set due to reaction gases and carrier gases after a temperature of at least 600° C. is reached, ranges between 0.1 kPa and 100 kPa.

13. The method defined in claim 1 wherein said pressure is set when the temperature reaches at least 800° C.

14. The method according to claim 1 wherein said reaction gas is selected from the group which consists of metal halogenides, methane, nitrogen , gases with C-N-groups, alcoholates, β-diketonates, carbonates or molecular precursors which deliver elements for the desired reaction deposition or pore filling.

15. The method defined in claim 13 wherein the reaction gas is a metallo-organic compound or acetonitrile.

16. The method according to claim 1 wherein on the substrate body carbides, nitrides or carbonitrides of the metals of Groups IVa to VIa of the classification of elements, $Al_2O_3$, $ZrO_2$, carbon as a diamond-like layer, amorphous carbon or hexagonal boron nitride are deposited.

17. The method according to claim 1 wherein on a substrate body of $Al_2O_3$ a layer with infiltrated $ZrO_2$ and at least one layer of TiC are deposited.

18. The method according to claim 1 wherein during the heating between 600° C. and 1100° C., only a thin first layer of a maximum of 1 μm is applied, the substrate body covered with the thin layer is then fully sintered and subsequently in the cooling phase the layer application of the thin layer is continued with the same layer material until the desired thickness of the first layer is achieved.

19. A composite body consisting of a hard metal, cermet or ceramic substrate body and at least one layer of a hard materials, ceramic material, a diamond-like layer, amorphous carbon and/or hexagonal boron nitride on the substrate body, wherein in a zone bordering the layer, in the substrate body materials like that of the layer adjacent the substrate body are embedded with an inwardly decreasing gradient to a penetration depth of a maximum of 200 μm, and a border surface between the substrate body surface and the layer has a roughness which corresponds approximately to the roughness of a partially densified green compact with an open porosity at 600° C. to 800° C. prior to sintering.

\* \* \* \* \*